US006759293B2

United States Patent
Cho et al.

(10) Patent No.: US 6,759,293 B2
(45) Date of Patent: Jul. 6, 2004

(54) METHOD FOR MANUFACTURING A CAPACITOR IN A SEMICONDUCTOR DEVICE

(75) Inventors: Kwang-Jun Cho, Kyoungki-do (KR); Ki-Seon Park, Kyoungki-do (KR)

(73) Assignee: Hynix Semiconductor Inc., Kyoungki-di (KR)

(*) Notice: Subject to any disclaimer, the term of this patent is extended or adjusted under 35 U.S.C. 154(b) by 85 days.

(21) Appl. No.: 10/054,520

(22) Filed: Jan. 22, 2002

(65) Prior Publication Data

US 2003/0003641 A1 Jan. 2, 2003

(30) Foreign Application Priority Data

Jun. 30, 2001 (KR) ........................................ 2001-38689

(51) Int. Cl.[7] ........................................ H01L 21/8242
(52) U.S. Cl. ........................................ 438/253; 438/396
(58) Field of Search ........................ 438/239, 244, 438/250, 253, 254, 393, 396, 397, 398; 257/296, 300, 301, 303, 306, 307, 532

(56) References Cited

U.S. PATENT DOCUMENTS 6,436,763 B1 * 8/2002 Huang et al. ............... 438/255

2001/0054730 A1 * 12/2001 Kim et al. ................... 257/301

FOREIGN PATENT DOCUMENTS

KR       2001-37680      5/2001

* cited by examiner

Primary Examiner—Long Pham
Assistant Examiner—Hoai Pham
(74) Attorney, Agent, or Firm—Marshall, Gerstein & Borun LLP (57) ABSTRACT

A method for forming a semiconductor device, which features omitting a separated procedure for forming a barrier layer by molding a bottom electrode of a capacitor with TiN compounds. The method for forming a bottom electrode of a capacitor with little roughness on the surface by skipping the etching step for patterning on a metallic layer includes: molding a storage node hole to expose the plug by forming a sacrificial layer on the semiconductor substrate where transistors and plugs are formed and etching the sacrificial layer optionally; and by embedding TiN in the storage node hole and separating the neighboring bottom electrodes in the chemical-mechanical polishing method or etch back.

16 Claims, 6 Drawing Sheets

METHOD FOR MANUFACTURING A CAPACITOR IN A SEMICONDUCTOR DEVICE

BACKGROUND

1. Technical Field

A method for manufacturing a semiconductor integrated circuit is disclosed. More particularly, a method for manufacturing a capacitor of a semiconductor device is disclosed.

2. Description of the Related Art

For a DRAM (Dynamic Random Access Memory), the memory cell area memorizing a bit, the standard unit for memory information, becomes smaller as the integration increases. However, the area of a capacitor cannot be reduced in proportion to the reduction of a cell. This is because more than a certain volume of capacitance is in need per cell for sensing, signal margin, sensing speed and durability for soft error caused by alpha particles. Capacitance C is in relation with the valid surface area A of a capacitor, dielectric constant $\in$ and thickness d of a dielectric substance as shown in Formula 1.

$$C = \in A/d \qquad (1)$$

Accordingly, to maintain the capacitance C of a capacitor in limited cell area, one should either reduce the thickness d of a dielectric substance, increase the valid surface area A of the capacitor, or use a material with a high dielectric constant $\in$.

Among them, the methods of minimizing the thickness d of a dielectric substance and of increasing the valid surface area of a capacitor with a three dimensional structure, such as a simple stack structure, concave structure, cylindrical structure and multi-layer pin structure have reached their limits due to the ultra miniaturization of semiconductor manufacturing process.

A conventional dielectric layer used for a capacitor has been mainly a NO (Nitride-Oxide) or ONO (Oxide-Nitride-Oxide) thin layer. However, the current situation requires the introduction of a new material, because there is limit to increase the capacitance that is already high, even though the thickness of a dielectric substance thin layer is reduced or the surface area is increased. This is because the dielectric constant of $SiO_2$, NO (Nitride-Oxide) or ONO (Oxide-Nitride-Oxide) layer are small.

Accordingly, high dielectric layers, e.g., $(Ba,Sr)TiO_3$ (BST), $SrTiO_3$ (STO), $(Pb,Zr)TiO_3$ (PZT), $(Pb,La)(Zr,Ti)O_3$ (PLZT), $SrBi_2Ta_2O_9$ (SBT), TaON and $Ta_2O_5$ are introduced to substitute the conventional dielectric thin layer in a highly integrated DRAM.

For capacitors using high dielectric layers, it is difficult to use polysilicon as an electrode material. Instead, they use noble metals or their oxides, such as Pt, Ir, Ru, $RuO_2$ and $IrO_2$, or conductive compounds like TiN.

For example, in case of using $Ta_2O_5$ as a dielectric layer, MIS (Metal/Insulator/Silicon) structure or MIM (Metal/Insulator/Metal) structure should be adopted. In case of using BST, the MIM (Metal/Insulator/Metal) structure is to be employed. When forming a capacitor electrode with the metals shown above, a barrier layer of TiN, TaN, TiSiN and TaAlN should be formed necessarily to prevent the reaction between the polysilicon plug or substrate silicon and the metal, to secure the ohmic contact property, and to prevent the diffusion of oxygen, which is used as a source while a dielectric layer is deposited.

Figure 1:
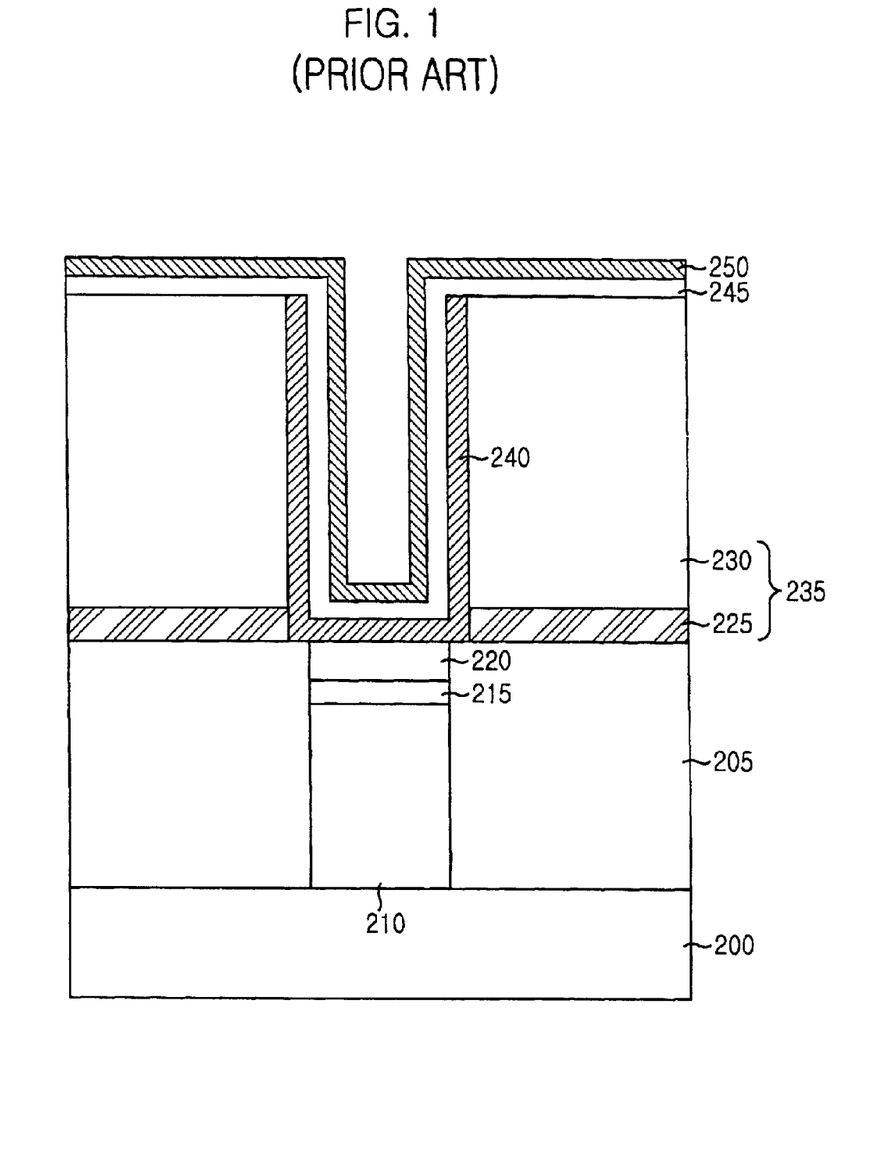
FIG. 1 is a cross-sectional view illustrating a conventional concave capacitor.

FIG. 1 is a cross-sectional view illustrating a conventional concave capacitor.

A concave capacitor and a cylinder capacitor are contrived to avoid the difficulty in etching that is caused as the height of the bottom electrode increases, in a three dimensional stack capacitor in response to the high integration tendency of a DRAM. The concave or cylinder capacity makes it possible to avoid the difficulty in etching process and control the height of a storage node.

Figure 2:
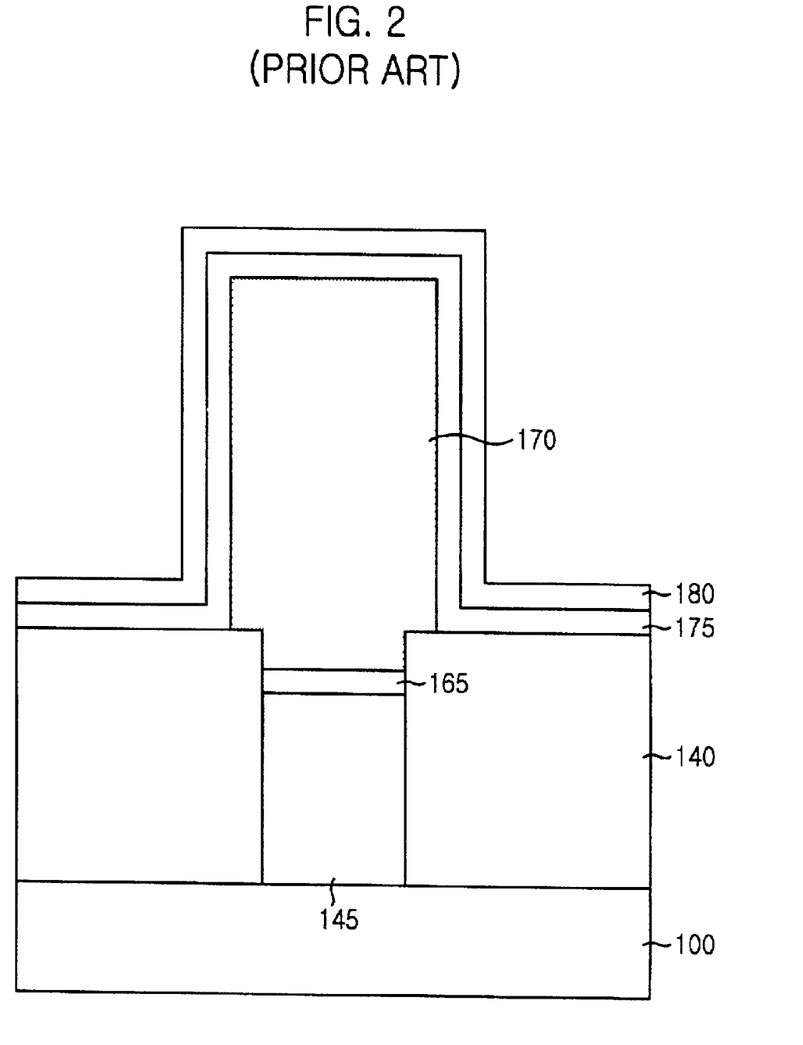
FIG. 2 is a cross-sectional view depicting a conventional stack capacitor.

FIG. 2 is a cross-sectional view depicting a conventional stack capacitor.

The stack structure is formed as follows. First, after the formation of an inter-layer insulation film 140 on a semiconductor substrate 100, a storage contact hole is formed and connected to an active region (not illustrated) of the semiconductor substrate through the inter-layer insulation film 140. Subsequently, a plug is molded by forming a polysilicon layer 145 and a barrier layer 165 and a silicide layer respectively. After the formation of the plug, the bottom electrode is deposited, etched selectively and thus a bottom electrode pattern 170 is formed. A stack capacitor is formed by molding a dielectric layer 180 and a top electrode 180 on the bottom electrode pattern 170 and patterning it.

When molding the bottom electrode of a simple stack capacitor with the metal as described above, there are following problems. That is, after the deposition of a metallic layer which forms the bottom electrode in the CVD (Chemical Vapor Deposition), the substrate should be etched and patterned. However, the noble metals used as a bottom electrode are hard and stable they hardly react with other chemicals, which makes them difficult to etch. It may be possible to do patterning in the reactive ion etching (RIE), but it is still difficult to obtain a desired sidewall profile with currently available etching equipment. Also, it is difficult as well to get a material for an etching mask with a lower etching degree than the noble metals. Lastly, the metallic layer deposed in the CVD has a problem that the amount of leakage current increases. This is because the surface of an electrode becomes rough by the elimination of impurities and subsequent thermal treatment, and thus the dielectric layer is not formed with a nonuniform thickness.

SUMMARY OF THE DISCLOSURE

Therefore, a method for manufacturing a semiconductor device is disclosed in which a capacitor can be formed with a simplified process.

A method for manufacturing a semiconductor device is also disclosed in which a metallic bottom electrode can be formed in a capacitor without etching a metallic layer.

A method for manufacturing a semiconductor device is also disclosed which can suppress the generation of leakage current caused by the rough surface of a bottom electrode.

In an embodiment of the disclosed method, a method for manufacturing a semiconductor device comprises: a) forming a contact hole to expose the joining portion by etching an inter-layer insulation layer on top of a semiconductor substrate optionally; b) forming a contact plug inside the contact hole; c) molding an etch stop layer and a sacrificial oxide layer on the contact plug and the inter-layer insulation layer; d) molding a storage node hole to expose the contact plug by etching the etch stop layer and the sacrificial oxide layer optionally; e) forming a TiN bottom electrode inside the storage node hole in the CVD method; f) separating the TiN bottom electrode neighboring the sacrificial layer by removing the TiN layer thereon; g) exposing the TiN bottom electrode pattern by removing the sacrificial oxide layer; h) forming a dielectric layer on the TiN bottom electrode pattern; and molding a top electrode on the dielectric layer.

BRIEF DESCRIPTION OF THE DRAWINGS

The above and other features of the disclosed method will become apparent from the following description of the preferred embodiments given in conjunction with the accompanying drawings, wherein.

DETAILED DESCRIPTION OF THE PRESENTLY PREFERRED EMBODIMENTS

Other aspects of the disclosed methods will become apparent from the following description of the embodiments with reference to the accompanying drawings, FIGS. 3A to 3G, which is set forth hereinafter.

Figure 3A:
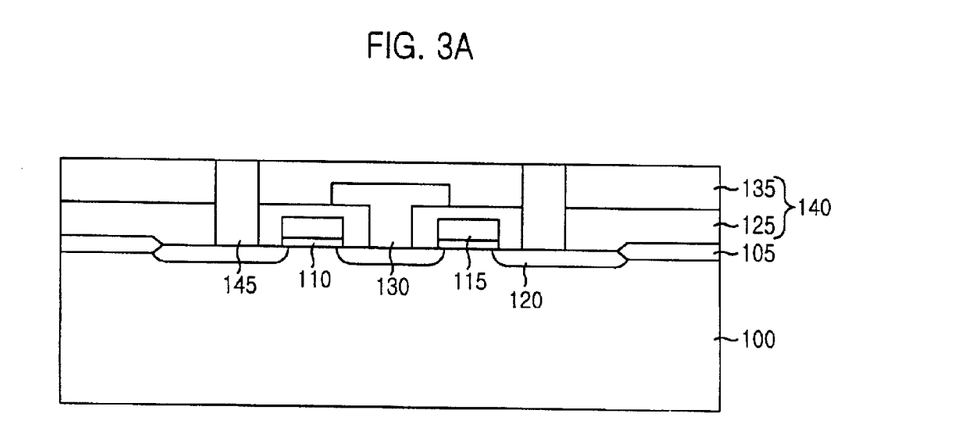
FIGS. 3A to 3G are cross-sectional views showing the process for forming a capacitor of a semiconductor device in accordance with one disclosed embodiment.

First, as shown in FIG. 3A, an element separation layer 105 is formed on a predetermined domain of a semiconductor substrate 100 to define active domains and inactive domains, and a MOS transistor composed of a gate insulation layer 110, gate electrode 115 and source/drain joining domain 120 is molded on the semiconductor substrate 100. Although not illustrated in the drawing, a spacer may be formed on the side of the gate electrode 115. A first contact hole is molded to expose the joining domain 120 of the MOS transister to be linked to a bitline by forming a first inter-layer insulation layer 125 on the front of the semiconductor substrate formed with the MOS transistor and patterning it. Then, a bitline 130 that is connected to the joining domain 120 is formed inside the first contact hole. Subsequently, a second inter-layer insulation layer 135 is molded on the front side of the semiconductor substrate 100 formed with the bitline 130. A second contact hole is molded by optionally etching the first and the second insulation layers 125, 135 to expose the joining domain 120 of the MOS transistor connected to a capacitor. A polysilicon plug 145 is molded inside the second contact hole by depositing polysilicon to fill up the second contact hole on the front side of the semiconductor substrate 100 formed with the second contact hole and etching the polysilicon until the second inter-layer insulation layer 135 is exposed.

Figure 3B:
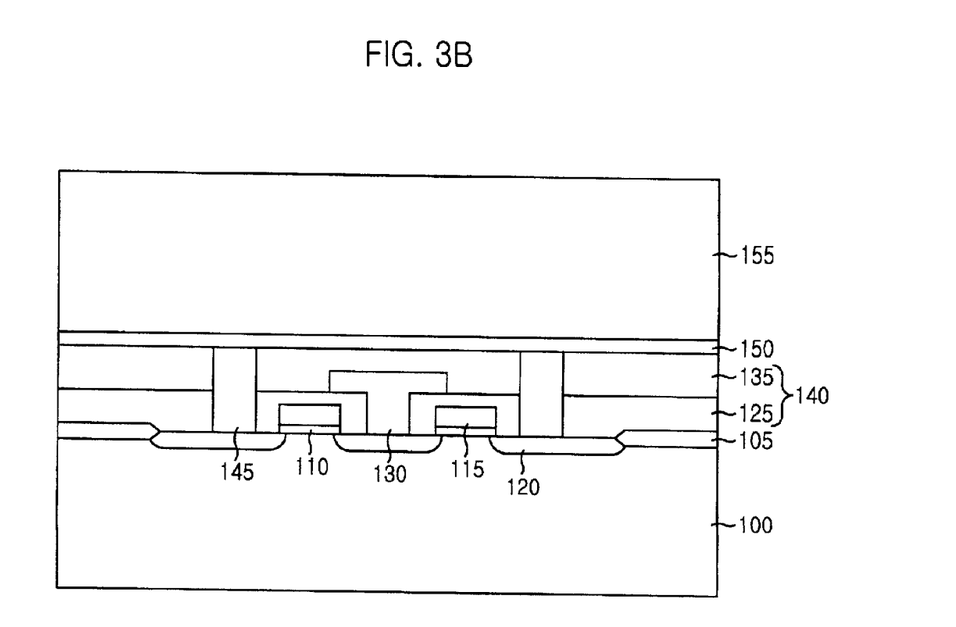

As illustrated in FIG. 3B, an etch stop layer 150 and a sacrificial oxide layer 155 are molded on top of the semiconductor substrate 100 where the polysilicon plug 145 are formed. The etch stop layer 150 is formed of SiN, $Al_2O_3$, SiON or $Si_3N_4$, which has a high wet etch selection rate to the upper layer, the sacrificial oxide layer 155.

Figure 3C:
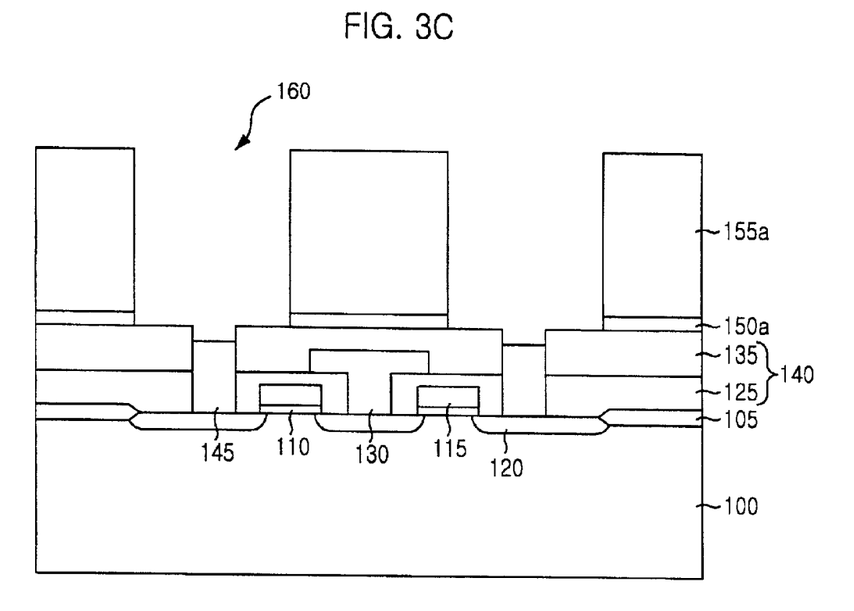

As depicted in FIG. 3C, a storage node hole 160 is molded to expose the polysilicon plug 145 and the interlayer insulation layer 135 around it by dry-etching the sacrificial oxide layer 155 and the etch stop layer 150 optionally and forming a sacrificial oxide layer pattern 155A and an etch stop layer pattern 150A.

Figure 3D:
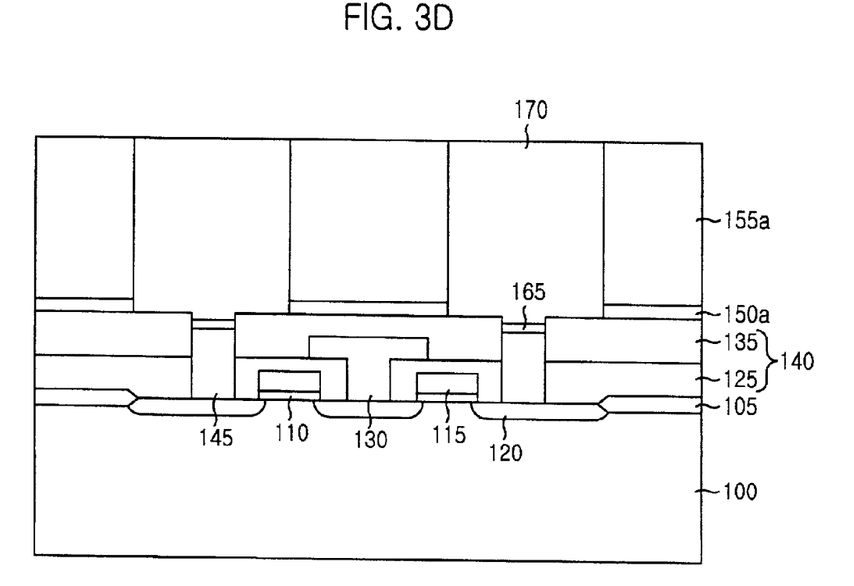

As shown in FIG. 3D, a silicide layer 165 is molded to reduce contact resistance by forming an ohmic contact on the surface of the polysilicon plug 145 exposed on the bottom surface of the storage node hole 160. The procedures for forming the silicide layer 165 are described hereinafter. Forming a metallic layer by depositing Ti, Co or Ni in the CVD method, it goes through a thermal treatment by using the rapid thermal processing (RTP) or a furnace. In the thermal treatment, the metallic layer part contacting the inter-layer insulation layer 135 or sacrificial oxide layer pattern 155A doesn't show a silicide reaction. However, the metallic layer on the polysilicon plug 145 reacts to the polysilicon plug 145 and becomes a silicide, thereby forming $TiSi_2$, $CoSi_2$ or $NiSi_2$ silicide layer 165 on the surface of the polysilicon plug 145. Cleaning the thermally treated semiconductor substrate with a mixture of $H_2SO_4$ and $H_2O_2$, the metallic layer that remains on the inter-layer insulation layer or sacrificial pattern 155A is removed.

Subsequently, a TiN bottom electrode pattern 170 is molded by embedding TiN in the storage node hole 160 in the CVD method and performing a storage node separation on the conductor layer of the bottom electrode. The storage node separation is to separate a plurality of TiN bottom electrode pattern 170 by removing TiN until the upper surface of the sacrificial oxide layer is exposed in the etch back or chemical-mechanical polishing (CMP) method.

Conventionally, a barrier layer made of TiN or others is formed on the silicide layer to prevent the oxygen diffusion after forming the silicide layer 165. However, the disclosed method skips the procedure of forming a barrier layer as mentioned before and simplifies the process by forming the entire bottom electrode with TiN.

Figure 3E:
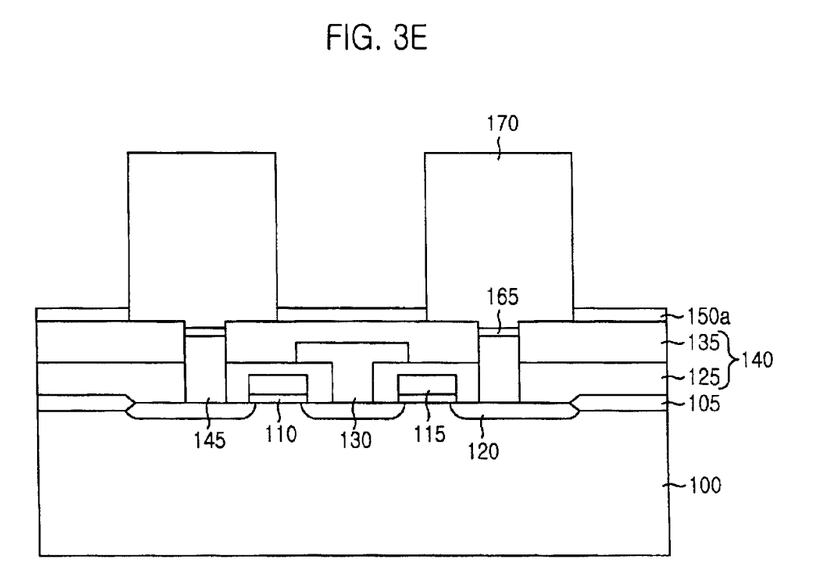

Subsequently, the sacrificial oxide layer 155A is wet etched and removed, and as shown in FIG. 3E, a TiN bottom electrode pattern 170 of a simple stack structure is exposed.

Figure 3F:
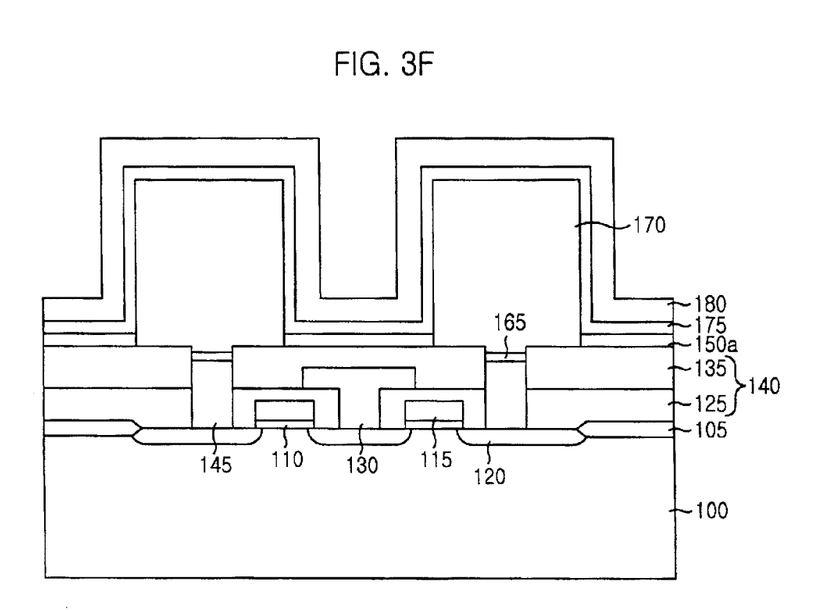
Figure 3G:
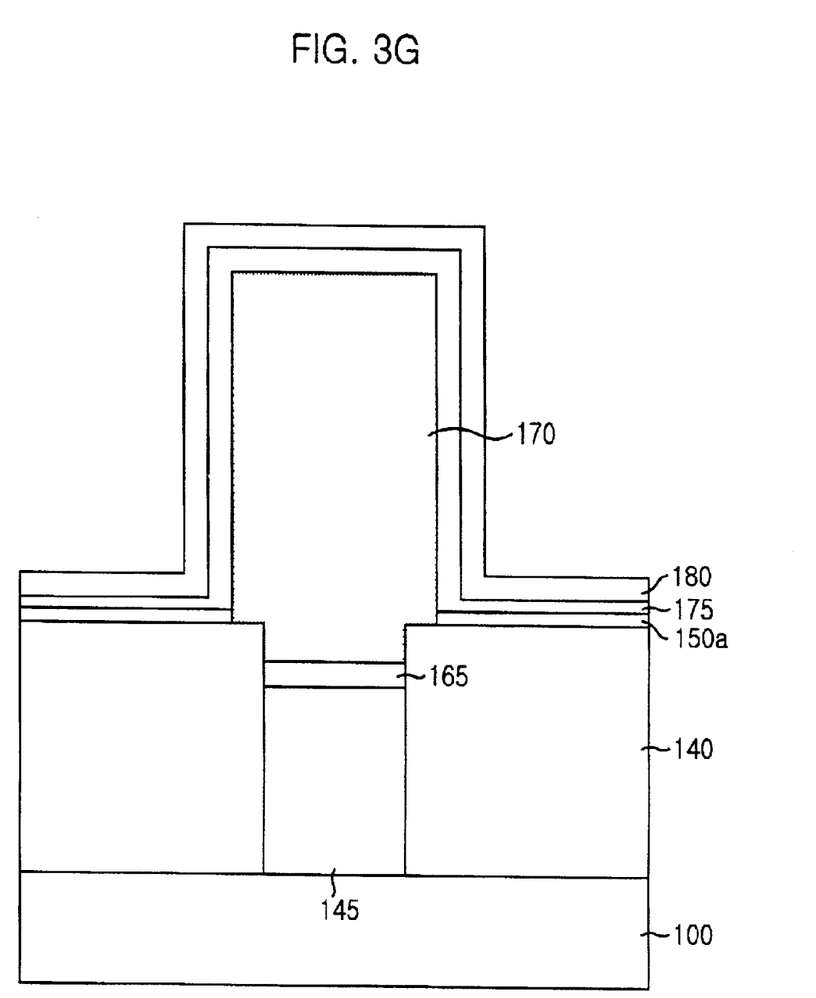

Then, as illustrated in FIG. 3F, a dielectric layer 175 and an top electrode 180 are molded one by one on the TiN bottom electrode pattern 170.

The dielectric layer 175 is formed of BST, STO, PZT, PLZT, SBT, TaON or $Ta_2O_5$, and for the top electrode 180, such an oxide electrode as TiN, Ru, Pt, Ir, Os, W, Mo, Co, Ni, Au, Ag, $RuO_2$ or $IrO_2$ can be used.

The disclosed method simplifies the process of manufacturing a semiconductor by omitting the procedures for forming a barrier layer on the conventional polysilicon contact plug.

Also, it is possible to form a bottom electrode without carrying out the process of etching a metallic layer for patterning and the deterioration of electric properties by leakage current can be prevented, because a TiN bottom electrode with little surface roughness can be obtained from the smooth sacrificial interface.

While the present invention has been described with respect to certain preferred embodiments, it will be apparent to those skilled in the art that various changes and modifications may be made without departing from the scope of the invention as defined in the following claims.

What is claimed is:

1. A method for manufacturing a semiconductor device, comprising:
   a) forming a contact hole to expose a joining portion by etching an inter-layer insulation layer disposed on top of a semiconductor substrate;
   b) forming a contact plug inside the contact hole;
   c) molding an etch stop layer and a sacrificial oxide layer on the contact plug and the inter-layer insulation layer;
   d) molding a storage node hole to expose the contact plug by etching the etch stop layer and the sacrificial oxide layer;
   e) molding a silicide layer on the contact plug;
   f) forming a TiN bottom electrode comprising a TiN layer inside the storage node hole by a CVD method;
   g) separating the TiN bottom electrode by removing the TiN layer;

h) exposing the TiN bottom electrode by removing the sacrificial oxide layer;

i) forming a dielectric layer on the TiN bottom electrode pattern; and j) molding a top electrode on the dielectric layer.

2. The method as recited in claim 1, wherein part b) further comprises:

forming the contact hole by etching the inter-layer insulation layer; and depositing a conductor layer inside the contact hole and leveling the conductor layer.

3. The method as recited in claim 2, wherein the depositing and leveling of the conductor layer is carried out with a CMP or an etch back.

4. A semiconductor device comprising a capacitor made in accordance with the method of claim 3.

5. The method as recited in claim 1, wherein the etch stop layer comprises a material selected from the group consistency of SIN, $Al_2O_3$, SiON and $Si_3N_4$.

6. The method as recited in claim 1, wherein at part d) of forming the storage node hole, the sacrificial oxide layer and the etch stop layer are dry etched.

7. The method as recited in claim 1, wherein at part d) of forming the storage node hole, the inter-layer insulation layer around the contact plug is exposed.

8. The method as recited in claim 1, wherein the contact plug comprises of polysilicon.

9. The method as recited in claim 1, wherein the step of forming the silicide layer further comprises:

depositing a metallic layer selected from the group consisting of Ti, Co and Ni on top of the semiconductor substrate where the storage node hole is molded; and forming the silicide layer selected from the group consisting of $TiSi_2$, $CoSi_2$ and $NiSi_2$ on the contact plug by thermally treating the metallic layer.

10. The method as recited in claim 9, further comprising the step of removing any metallic layer not connected to a suicide layer and that remains after the step of forming the silicide layer.

11. The method as recited in claim 10, wherein at the step of removing the metallic layer, the metallic layer is removed in a cleaning process using a mixture of $H_2SO_4$ and $H_2O_2$.

12. A semiconductor device comprising a capacitor made in accordance with the method of claim 11.

13. The method as recited in claim 1, wherein at the step of separating the TiN bottom electrode neighboring the sacrificial oxide layer, the TiN layer is removed in the chemical-mechanical polishing method until the sacrificial oxide layer is exposed.

14. The method as recited in claim 1, wherein the dielectric layer is selected from the group consisting of BST, STO, PZT, PLZT, SBT, TaON and $Ta_2O_5$.

15. The method as recited in claim 1, wherein the top electrode is selected from the group consisting of TiN, Ru, Pt, Ir, Os, W, Mo, Co, Ni, Au, Ag, RuO2 or $IrO_2$.

16. A semiconductor device comprising a capacitor made in accordance with the method of claim 1.

* * * * *

UNITED STATES PATENT AND TRADEMARK OFFICE
CERTIFICATE OF CORRECTION

PATENT NO. : 6,759,293 B2
DATED : July 6, 2004
INVENTOR(S) : Kwang-Jun Cho et al.

It is certified that error appears in the above-identified patent and that said Letters Patent is hereby corrected as shown below:

Column 5,
Line 20, please delete "SIN" and replace with -- SiN --.

Column 6,
Line 9, please delete "suicide" and replace with -- silicide --.

Signed and Sealed this

Thirtieth Day of November, 2004

JON W. DUDAS
*Director of the United States Patent and Trademark Office*